United States Patent
Børsheim

(10) Patent No.: US 11,417,919 B2
(45) Date of Patent: Aug. 16, 2022

(54) METHOD OF ASSEMBLING AN ENERGY STORAGE SYSTEM

(71) Applicant: Siemens Energy AS, Oslo (NO)

(72) Inventor: Eirik Børsheim, Oslo (NO)

(73) Assignee: Siemens Energy AS, Oslo (NO)

( * ) Notice: Subject to any disclaimer, the term of this patent is extended or adjusted under 35 U.S.C. 154(b) by 175 days.

(21) Appl. No.: 16/961,668

(22) PCT Filed: Jan. 14, 2019

(86) PCT No.: PCT/EP2019/050742
§ 371 (c)(1),
(2) Date: Jul. 11, 2020

(87) PCT Pub. No.: WO2019/141610
PCT Pub. Date: Jul. 25, 2019

(65) Prior Publication Data
US 2020/0400752 A1    Dec. 24, 2020

(30) Foreign Application Priority Data
Jan. 17, 2018 (GB) ..................................... 1800759

(51) Int. Cl.
*G01R 31/385* (2019.01)
*G01R 31/50* (2020.01)
(Continued)

(52) U.S. Cl.
CPC ...... *H01M 10/482* (2013.01); *G01R 31/3865* (2019.01); *G01R 31/50* (2020.01);
(Continued)

(58) Field of Classification Search
CPC ............. H01M 10/482; H01M 10/613; H01M 10/627; H01M 10/6567; H01M 50/20;
(Continued)

(56) References Cited

U.S. PATENT DOCUMENTS 4,098,962 A * 7/1978 Dennison .......... H01M 10/0463
429/120

FOREIGN PATENT DOCUMENTS

CN    204130610 U *  1/2015  ............. Y02E 60/10
DE    102013013950 A1    2/2015
(Continued)

OTHER PUBLICATIONS

PCT International Search Report and Written Opinion of International Searching Authority dated Apr. 4, 2019 corresponding to PCT International Application No. PCT/EP2019/050742 filed Jan. 14, 2019.

*Primary Examiner* — Kaity V Chandler

(57) ABSTRACT

A method of assembling and electrically interconnecting an energy storage system, the system includes a cabinet and a plurality of energy storage modules which may be connected together in the cabinet, each energy storage module has a plurality of energy storage devices. The method includes carrying out an electrical interconnection step by providing a removable current monitoring device at one pole of a circuit of the cabinet during the electrical interconnection step; connecting a first module to the pole; monitoring current flow after connecting the first module and, if no current flow is detected, connecting a further module in series with the first module. The monitoring and connecting steps are repeated for each subsequent module until all modules of the cabinet have been electrically interconnected. The final module is connected to the other pole of the circuit and the current monitoring device is disconnected and removed from the circuit.

8 Claims, 2 Drawing Sheets

(51) Int. Cl.
    *H01M 10/48*         (2006.01)
    *H01M 10/613*       (2014.01)
    *H01M 10/627*       (2014.01)
    *H01M 10/6567*     (2014.01)
    *H01M 50/20*        (2021.01)

(52) U.S. Cl.
    CPC ....... *H01M 10/613* (2015.04); *H01M 10/627* (2015.04); *H01M 10/6567* (2015.04); *H01M 50/20* (2021.01); *H01M 2220/10* (2013.01)

(58) Field of Classification Search
    CPC ........... H01M 2220/10; G01R 31/3865; G01R 31/50; Y02E 60/10
    See application file for complete search history.

(56) References Cited

FOREIGN PATENT DOCUMENTS

| | | | | |
|---|---|---|---|---|
| DE | 102014003325 | * | 9/2015 | ............. G01R 27/18 |
| DE | 102014003325 | A1 | 9/2015 | |
| DE | 102014003910 | A1 | 9/2015 | |
| EP | 2930811 | A1 | 10/2015 | |
| EP | 2945243 | A1 | 11/2015 | |

* cited by examiner

METHOD OF ASSEMBLING AN ENERGY STORAGE SYSTEM

CROSS REFERENCE TO RELATED APPLICATIONS

This application is the US National Stage of International Application No. PCT/EP2019/050742 filed 14 Jan. 2019, and claims the benefit thereof. The International Application claims the benefit of United Kingdom Application No. GB 1800759.1 filed 17 Jan. 2018. All of the applications are incorporated by reference herein in their entirety.

FIELD OF INVENTION

This invention relates to a method of assembling and electrically interconnecting energy storage modules in an energy storage system, in particular for modules comprising an electrochemical cell, or battery, providing electrical energy to an end user.

BACKGROUND OF INVENTION

Stored electrical energy modules, or power units of various types are becoming increasingly common in many applications, in particular for use where there are environmental concerns relating to emissions in sensitive environments, or public health concerns. Stored electrical energy power units are typically used to provide electrical energy to operate equipment, to avoid emissions at the point of use, although that stored energy may have been generated in many different ways. Stored electrical energy may also be used to provide peak shaving in systems otherwise supplied from the grid, or from various types of power generation system, including diesel generators, gas turbines, or renewable energy sources. Aircraft, vehicles, vessels, offshore rigs, or rigs and other powered equipment in remote locations are examples of users of large scale stored electrical energy. Vehicle drivers may use the stored energy power unit in city centres and charge from an internal combustion engine on trunk roads, to reduce the harmful emissions in the towns and cities, or they may charge up from an electricity supply. Ferries which carry out most of their voyage relatively close to inhabited areas, or in sensitive environments are being designed with hybrid, or fully electric drive systems. Ferries may operate with stored energy to power the vessel when close to shore, using diesel generators offshore to recharge the batteries. In some countries the availability of electricity from renewable energy sources to use to charge the stored energy unit means that a fully electric vessel may be used, provided that the stored energy units are sufficiently reliable for the distances being covered, with no diesel, or other non-renewable energy source used at all. Whether hybrid, or fully electric, the stored energy units may be charged from a shore supply when docked. The development of technology to achieve stored energy units that are reliable enough for prolonged use as the primary power source must address certain technical issues.

SUMMARY OF INVENTION

In accordance with a first aspect of the present invention, a method of assembling and electrically interconnecting modules of an energy storage system, the system comprising a cabinet and a plurality of energy storage modules which may be connected together in the cabinet, each energy storage module comprising a plurality of energy storage devices; the method comprising carrying out an electrical interconnection step by providing a removable current monitoring device at one pole of a circuit of the cabinet during the electrical interconnection step; connecting a first module to the pole; monitoring current flow after connecting the first module; if no current flow is detected, connecting a further module in series with the first module; repeating the monitoring and connecting steps for each subsequent module until all modules of the cabinet have been electrically interconnected; connecting the final module to the other pole of the circuit; and disconnecting and removing the current monitoring device from the circuit.

If current flow is detected in the current monitoring device, not connecting another module, but determining whether the fault is in the module, or other part of the circuit; removing the faulty module or part; installing a repaired, or replacement module or part, and repeating the current monitoring step.

Advantageously, the method further comprises connecting the fully installed cabinet to the power supply system.

Advantageously, the energy storage system comprises a plurality of cabinets, each installed before being connected to the power supply system.

Advantageously, each energy storage module comprises a plurality of energy storage devices electrically connected together in series to provide between 50V DC and 150 V DC.

Advantageously, each cabinet comprises a plurality of modules electrically connected together in series to provide at least 1000V DC.

Advantageously, each of the energy storage modules comprises a water-cooled polymer or thermoplastic housing.

BRIEF DESCRIPTION OF THE DRAWINGS

An example of a method of installing energy storage modules in an energy storage system according to the present invention will now be described with reference to the accompany drawings in which.

DETAILED DESCRIPTION OF INVENTION

Figure 1:
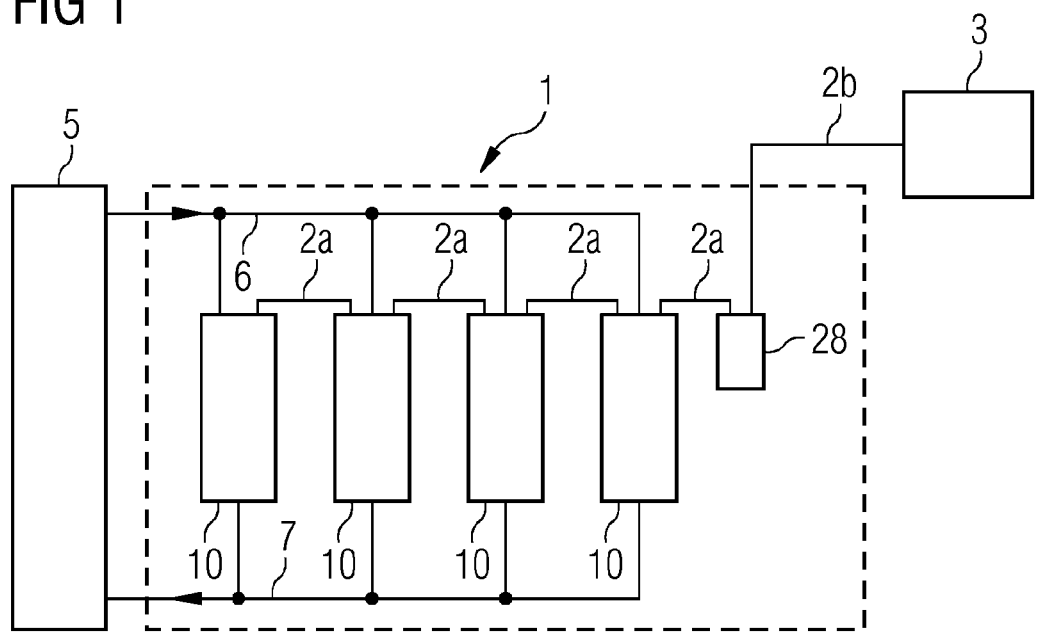
FIG. 1 is a block diagram illustrating an example of a modular stored energy system, in which the method of the present invention may be applied.

Energy storage systems for supplying DC electrical energy for marine applications, such as systems onboard vessels and offshore platforms, have high voltage and current requirements. They may need to provide voltage levels of 1 KV DC, or higher, which are achieved by combining multiple energy storage modules operating at voltages between 50V DC and 200V DC, typically around 100V DC. In the examples shown, the energy storage module cooling systems are fluidly connected in parallel and the energy storage modules are electrically connected together in series. Alternatively, the cooling systems may be connected together in series. Each module may comprise a plurality of energy storage devices, such as battery cells, connected together in series to provide the required total module voltage. Typically, this is of the order of 100V to 150V DC, using energy storage devices each rated at between 3V and 12V. For example, each battery cell may only have a voltage of the order of 3V, but in a module having twenty eight cells, electrically connected together in series, this results in a voltage closer to 100V. Multiple modules may be coupled together to be able to provide sufficient DC voltage to power systems on the vessel, for example, 1 KV or more.

Early large-scale batteries were lead acid, but more recently, lithium ion batteries have been developed for electrical energy storage for large scale applications. Li-ion batteries are typically pressurised and the electrolyte is flammable, so they require care in use and storage. A problem which may occur with Li-ion batteries is thermal runaway which may be caused by an internal short circuit in a battery cell, created during manufacture. Other causes, such as mechanical damage, overcharge, or uncontrolled current may also cause thermal runaway, but the battery system design is typically adapted to avoid these. Manufacturing issues with the cells cannot be ruled out entirely, so precautions are required to minimise the effect should thermal runaway occur. In a large-scale Li-ion battery system, the amount of energy that is released during a thermal runaway is a challenge to contain. A thermal event may increase temperatures in a single cell from a standard operating temperature in the range of 20° C. to 26° C. to as much as 700° C. to 1000° C. Safe operating temperatures are below 60° C., so this is a significant problem.

There are strict regulations in the marine and offshore industries regarding risk to the vessel or rig, one requirement being that there should be no transfer of excess temperature from one cell to another. If overheating occurs, then it should be contained in a single cell and not allowed to spread. In addition, for marine and offshore applications, weight and volume of any equipment is severely restricted, leading to compact, lightweight systems being advantageous. It is a challenge to produce a compact, lightweight, system that achieves the required thermal isolation and cools the cell in which excess heating occurs, quickly and efficiently.

In a Li-ion battery system, it is very important that the temperature of the battery cells does not exceed the prescribed operating temperature and that the cell temperature in the entire system is uniform. Sustained operation outside the prescribed operating temperature window may severely affect the lifetime of the battery cells and increases the risk of thermal runaway occurring.

For marine applications, there is a particular focus on using energy storage modules, such as batteries, at their maximum charge or discharge rate due to cost of installation and the weight and space taken up by the modules when on a vessel or offshore platform. Furthermore, maintenance and repair, or replacement is complicated and expensive compared to land-based uses of stored energy systems, so extending the lifespan of stored energy modules is particularly important. For the example of Li-ion batteries, these are sensitive to high temperature, so it is important to ensure that the operating and ambient temperature are controlled for all cells of a Li-ion battery system to ensure the design lifetime is met. Local variations or hot spots on a single cell may also compromise the total lifetime achievable.

An example of an energy storage system in which the present invention may be applied is illustrated in FIG. 1. The system comprises a cabinet, or cubicle 1, in which a plurality of energy storage modules 10 are electrically connected together in series by buses 2a to a cubicle controller 28 and by bus 2b to a central controller 3. Each of the energy storage modules is cooled by cooling fluid, circulating from cooling system 5 through inlet pipes 6 and outlet pipes 7. The cooling fluid is typically water which is inexpensive and easier to source and dispose of than synthetic coolants. Additives may be provided, for example to inhibit freezing, biogrowth, or corrosion. Typically, the proportion of additive is determined by the additive chosen, for example 20% frost inhibitor. Each energy storage module 10 comprises a plurality of energy storage devices, for example battery cells, electrically connected together in series. A modular system of this type, incorporating cooling, is particularly applicable for Li-ion cells.

Within a module 10, on one side of each cell, a battery cell cooler is provided which receives cooling fluid from the cooling system 5 via the inlet pipes 6 and outlet pipes 7 to cool the battery cell. The cell cooler comprises tubing for the cooling fluid to flow through, which may be metal tubing, but more typically is a synthetic material, such as polymer plastics, for example polythene, polyamide, such as PA66 plastics, or thermoplastics such as TCE2, TCE5, or other suitable materials, which may be moulded or extruded to the required shape and is able to withstand normal operating temperatures of the energy storage modules 10. Cooling is provided on both sides of the cell, as there is no need for additional thermal insulation between the cells, which is common in conventional battery systems. Typically, one side of the cell is provided with a flexible material to allow for natural swelling of the cell, so cooling on the side with the flexible material is less effective. The flexible material ensures that the correct pressure is maintained over time as the cell swells.

Assembly and installation of such modular energy storage systems may be improved.

One improvement is to carry out continuous earth fault monitoring during installation of the modules 10 in the cabinet 1 in case the insulation between the power circuit in the battery and other conductive parts, for example insulation between any of the battery phases and a grounded electrically conductive component such as the module chassis, fails, or is damaged, allowing normally insulated parts to come into electrical contact with one another. Earth faults may be single phase to ground faults at a specific location. However, in some circumstances two separate single phase to ground faults may occur simultaneously, at different locations. These are commonly known as a double earth faults. In a conventional lead acid based system, such a double earth fault may occur several times without causing significant damage to the battery material and in practice may be hard to even identify. By contrast, in a Li-ion based energy storage system a double earth fault is a safety concern due to the amount of energy involved and the greater likelihood of such a fault causing damage to the Li-ion cells. In conventional systems, practical constraints in terms of set-up and connection mean that any monitoring for earth faults is only possible in an operational system, after installation is complete and no account is taken of the potential for double earth faults during installation.

Li-ion battery systems for marine purposes are typically built with power cable connections in front of the battery modules. This allows shipyard workers to install the modules in the cabinet, or a racking system, but the actual connection of the power cables is carried out later by service personnel from the equipment supplier, so that all safety matters regarding short circuits, reversed polarity and earth faults are then the responsibility of the battery manufacturer. As mentioned above, the norm is to provide earth fault monitoring on a system or pack level, which is only activated after the full installation has been completed and all modules are connected in the cabinet. If an earth fault is present at cubicle level, or modules with an earth fault are connected to the cubicle, this poses a serious safety risk for the installation personnel. A single earth fault can usually be handled in an IT power system, meaning a system where there is no connection between the power phases and earth, but a double earth fault will cause a short circuit. Causes of earth faults include mechanical damage during transport, or environmental damage due to humidity or storage conditions, both of which may affect multiple modules from the same production batch.

The introduction of modular systems gives rise to the possibility that personnel other than battery supplier service personnel need to do the connection work, altering the safety considerations. Prior to connection of the cabinet to the rest of the energy storage system, but after all of the modules have been installed in the cabinet, it is possible to make earth fault detection checks, at a pack level, for leakage current to ground, prior to connection of the cabinet into the vessel power supply system. These checks may be made using earth fault monitoring equipment connected to the positive terminal of the cabinet and the connection being started at the negative terminal of the cabinet, but these checks are not made during installation because the control power is typically not available and the installed current measuring device which carries out long term monitoring has not been installed that point. The modules may have been checked for earth faults at the end of the production line, but checking each module again individually prior to installation, to ensure that no faults have arisen during transport and storage, adds time and hence cost. In addition, for further certainty, it would be necessary to check each individual busbar in the cubicle, or rack, in which the modules are being installed.

Figure 2:
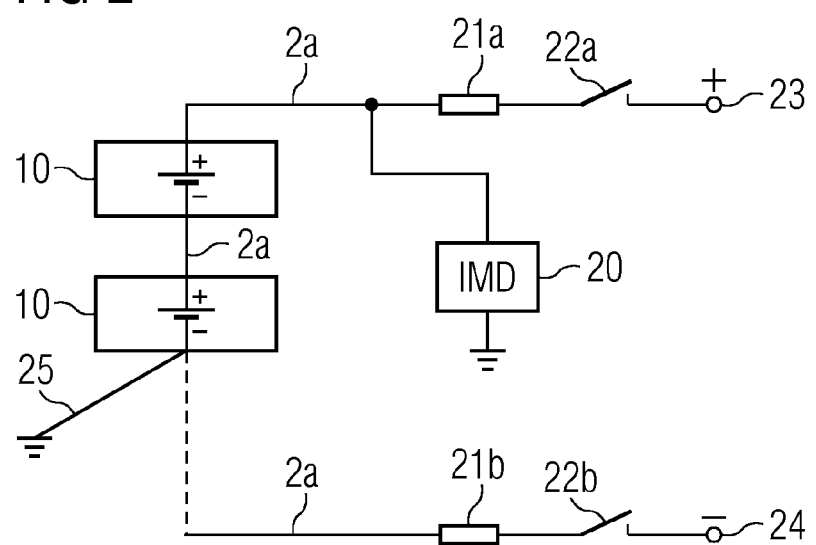
FIG. 2 illustrates circuitry of a modular stored energy system of FIG. 1, for the method of the present invention.

FIG. 2 illustrates an example of a circuit formed when carrying out current measurement during installation and electrical interconnection of the modules of an energy storage system, in a cabinet. A removable current measurement device 20 may be connected via a resistor 21a, 21b and isolating switch 22a, 22b to either the positive or negative pole. In this example, the connection is to the positive pole 23. The connection is made to the phase where the electrical interconnection of the modules is to start and modules are connected together in sequence from there. In this example, the positive side of the first module 10 is connected via DC bus 2a via the resistor 21a and switch 22a to the positive pole 23. DC bus 2a also connects each of the modules 10 to the next module in series. As can be seen in FIG. 2, there are two modules 10 already connected in series. If the last of the modules in series has a connection to ground, the current measuring device 20 detects current flow. The installation process is then stopped to determine the source of the connection to ground and the appropriate corrective action is taken, whether to the busbar 2a, or the module 10, itself. The operator then continues the electrical interconnection process with the next module, repairing or replacing, as necessary until all the modules for that cabinet have been connected. The final module 10 in the cabinet 1 is connected via resistor 21b and switch 22b to the negative pole 24 of the cabinet 1.

As mentioned above, the current measuring device may be used on either the negative phase or the positive phase. If the connection were to have been to the negative phase in FIG. 2, then the current measurement device 20 would have been connected between resistor 21b and the first module would have been connected via bus 2a, resistor 21b and switch 22b to the negative pole 24. The final module to be connected would then have been connected via bus 2a, resistor 21a and switch 22a to the positive pole 23.

Figure 3:
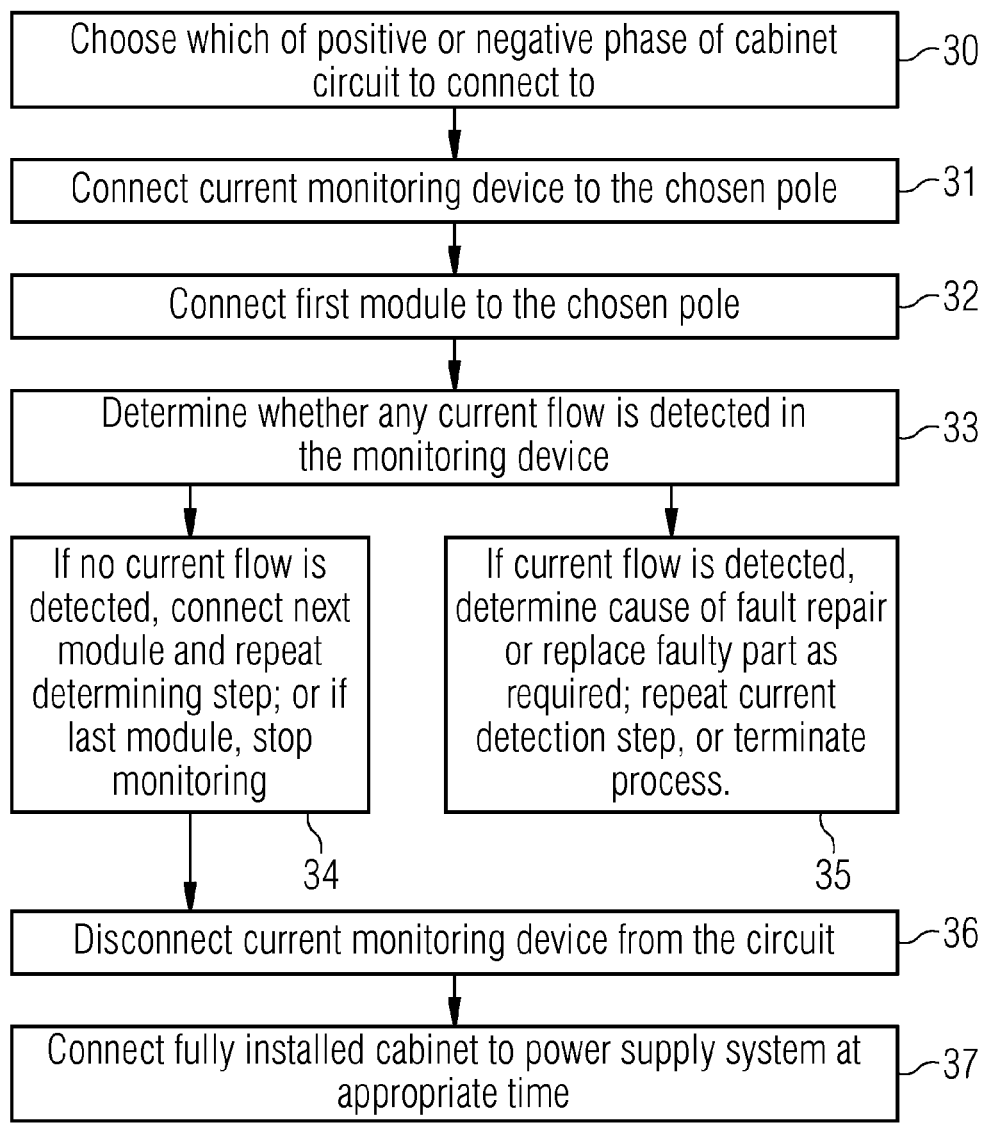
FIG. 3 is a flow diagram illustrating installation according to the method of the present invention, of modules of an energy storage system in a cabinet.

The installation and electrical interconnection process of the present invention is illustrated in the flow diagram of FIG. 3. To start the process, a choice is made 30 as to which of the positive or negative phase of the cabinet circuit is to be connected to. The removable current monitoring device is then connected 31 to the chosen pole of the cabinet circuit. The current monitoring device is typically a self-contained device with its own power supply, such as a battery pack, and does not require any external power to be provided. This is helpful in situations where the cabinets are being installed before there is any power available in the vessel, or platform that the cabinets are being installed in. The current monitoring device is not intended to remain connected after the assembly and electrical interconnection has been completed, but is intended to be removed and used on the next job.

The first module is connected 32 to the chosen pole, typically via a resistor 21a, 21b and an isolating switch 22a, 22b. The operator checks 33 whether any current flow is detected in the monitoring device and if no current flow is detected 34, the operator connects a further module and repeats the check 33. The operator then connects each of the next module in the series for that cabinet and repeats the check 33 for each, until all the modules have been checked. If the last module for that cabinet has been reached and successfully installed, the monitoring is stopped. The current monitoring device is then disconnected 36 and removed from the circuit. If current flow is detected at any point in the electrical interconnection steps, then the operator may try to determine 35 the cause of fault and carry out a repair, or replace the faulty part as required. The repaired module is then connected again and the current detection step 33 is repeated to check that the module is no longer causing a fault. If the repair or replacement is unsuccessful, the process may be terminated for further investigation. Once all of the modules have been successfully installed and electrically interconnected in their cabinet then the fully installed cabinet may be connected 37 to the power supply system at an appropriate time. This may follow on directly from the installation, if all other cabinets are ready, or may be done some time later.

Using a removable, external, current measurement device in the way described, saves cost and space in the system, as the function carried out by the current measurement device is only applicable during the installation phase. If modules need to be removed for maintenance, or replaced, after the system is operational, the cabinet may be disconnected, the modules removed and when replaced, the current measurement device 20 is connected again to the appropriate pole and the modules 10 re-installed as described above. Thereafter, the current measurement device is disconnected and removed from the cabinet circuit. Carrying out earth fault monitoring during installation of the system makes the process and the system safer.

Since the current measurement device does not require external power, installation of the battery system is not restricted by the progress of the rest of the vessel, which can be a typical constraint during commissioning of such a system. A reusable and inexpensive design of current measurement device may be used. The external measurement device may be an insulation monitoring device, or current measurement device, and may be used to continuously monitor the energy storage devices in the cabinet circuit as they are being connected. During installation and test, if a first earth fault is detected, the installation work can be stopped and the faulty module, or cubicle section, repaired, or replaced. The current measurement device may be connected to the phase where the first module is inserted, on either a positive phase, or a negative phase.

The present invention may be applied to an incomplete circuit, carrying out continuous earth fault monitoring as each module is connected during installation of the modules in the cabinet to ensure that a double earth fault does not occur during the installation. A single current monitoring device which may be taken by the operator from one task to the next is used for the current measurement during assembly. If the measurement device were left connected to the system after installation of the modules, it might introduce an earth fault during operation, which is not acceptable. After installation and electrical interconnection of the modules, the measurement device is no longer required by that cabinet and can be used for assembly of the next cabinet. This saves both cost and space compared to fixed test equipment, i.e. providing earth fault monitoring for each module. Space, in particular, is at a premium on board a vessel, or offshore platform.

Although an alternative would be to provide a device installed in each cabinet to monitor the insulation resistance, this requires one fixed device per cubicle. The monitoring device must be connected to the negative pole, and module connection must start at the negative pole. A fixed solution must also incorporate a switch that can ensure that the measurement device is not connected when the system connects to the DC bus and other power sources. Such a system depends on external power as it must be normally open, but in practice, external power is often not available at this stage of the vessel installation, delaying installation of the modules until the external power is available. Thus, a fixed solution adds cost and complexity and reduces available space and the mean time between failures. If required, earth fault monitoring of the complete installed system may be provided quite separately, using conventional equipment.

Although the detailed examples have been given with respect to electrochemical cells, such as batteries, for example Li-ion, alkaline, or NiMh batteries, or others, the invention applies to other types of stored energy units, in particular non-cylindrical capacitors, ultracapacitors, or supercapacitors, fuel cells, or other types of energy storage which have a surface that can be cooled by a cooler and which may also suffer if the temperature of modules of the stored energy units regularly goes outside an advantageous operating range, reducing the overall lifetime and increasing.

The invention claimed is:

1. A method of assembling and electrically interconnecting an energy storage system, the system comprising a cabinet and a plurality of energy storage modules which may be connected together in the cabinet, each energy storage module comprising a plurality of energy storage devices; the method comprising:
    carrying out an electrical interconnection step by providing a removable current monitoring device at one pole of a circuit of the cabinet during the electrical interconnection step;
    connecting a first module to the pole;
    monitoring current flow after connecting the first module;
    when no current flow is detected, connecting a further module in series with the first module;
    repeating the monitoring and connecting steps for each subsequent module until all modules of the cabinet have been electrically interconnected;
    connecting a final module to the other pole of the circuit; and
    disconnecting and removing the current monitoring device from the circuit.

2. The method according to claim 1, wherein, when current flow is detected, not connecting another module.

3. The method according to claim 1, wherein, when current flow is detected in the current monitoring device, determining whether a fault is in the module, or in another part of the circuit;
    removing the faulty module or part;
    installing a repaired, or replacement module or part, and repeating the current monitoring step.

4. The method according to claim 1, further comprising: connecting the fully installed cabinet to a power supply system.

5. The method according to claim 1, wherein the energy storage system comprises a plurality of cabinets, each installed before being connected to a power supply system.

6. The method according to claim 1, wherein each energy storage module comprises a plurality of energy storage devices electrically connected together in series to provide between 50V DC and 150V DC.

7. The method according to claim 1, wherein each cabinet comprises a plurality of modules electrically connected together in series to provide at least 1000V DC.

8. The method according to claim 1, wherein each of the energy storage modules comprises a water-cooled polymer or thermoplastic housing.

* * * * *